(12) United States Patent
Suzuki et al.

(10) Patent No.: US 9,240,445 B2
(45) Date of Patent: Jan. 19, 2016

(54) LATERAL SEMICONDUCTOR DEVICE

(75) Inventors: Takashi Suzuki, Toyota (JP); Norihito Tokura, Okazaki (JP); Satoshi Shiraki, Toyohashi (JP); Shigeki Takahashi, Okazaki (JP); Youichi Ashida, Nukata-gun (JP); Akira Yamada, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/113,419

(22) PCT Filed: May 10, 2012

(86) PCT No.: PCT/JP2012/003065
§ 371 (c)(1),
(2), (4) Date: Oct. 23, 2013

(87) PCT Pub. No.: WO2012/157223
PCT Pub. Date: Nov. 22, 2012

(65) Prior Publication Data
US 2014/0048911 A1   Feb. 20, 2014

(30) Foreign Application Priority Data

May 13, 2011   (JP) .................................. 2011-108485
Apr. 9, 2012   (JP) .................................. 2012-088455

(51) Int. Cl.
*H01L 23/62*   (2006.01)
*H01L 29/06*   (2006.01)
(Continued)

(52) U.S. Cl.
CPC .......... *H01L 29/063* (2013.01); *H01L 29/0692* (2013.01); *H01L 29/402* (2013.01); *H01L 29/404* (2013.01); *H01L 29/405* (2013.01); *H01L 29/861* (2013.01)

(58) Field of Classification Search
CPC . H01L 29/063; H01L 29/0692; H01L 29/402; H01L 29/404; H01L 29/405; H01L 29/861; H01L 29/7811; H01L 29/7823
See application file for complete search history.

(56) References Cited

U.S. PATENT DOCUMENTS 5,304,836 A *   4/1994   Lao et al. ....................... 257/399
6,150,702 A    11/2000   Funaki et al.
(Continued)

FOREIGN PATENT DOCUMENTS

JP   07-326775 A   12/1995
JP   2001-352064 A   12/2001
(Continued)

OTHER PUBLICATIONS

International Search Report and Written Opinion of the International Searching Authority mailed Jun. 5, 2012 for the corresponding international application No. PCT/JP2012/003065 (with English translation).

(Continued)

*Primary Examiner* — Su C Kim
(74) *Attorney, Agent, or Firm* — Posz Law Group, PLC (57) ABSTRACT

A lateral semiconductor device includes a semiconductor layer, an insulating layer, and a resistive field plate. The semiconductor layer includes a first semiconductor region and a second semiconductor region at a surface portion, and the second semiconductor region makes a circuit around the first semiconductor region. The insulating layer is formed on a surface of the semiconductor layer and is disposed between the first and second semiconductor regions. The resistive field plate is formed on a surface of the insulating layer. Between the first and second semiconductor regions, a first section and a second section are adjacent to each other along a circumferential direction around the first semiconductor region. The resistive field plate includes first and second resistive field plate sections respectively formed in the first and second sections, and the first and second resistive field plate sections are separated from each other.

6 Claims, 7 Drawing Sheets

(51) Int. Cl.
*H01L 29/40* (2006.01)
*H01L 29/861* (2006.01)

(56) References Cited

U.S. PATENT DOCUMENTS

| | | |
|---|---|---|
| 2001/0048122 A1* | 12/2001 | Tada et al. .................... 257/240 |
| 2002/0137318 A1* | 9/2002 | Peake et al. .................. 438/585 |
| 2003/0209774 A1 | 11/2003 | Jimbo et al. |
| 2004/0251499 A1 | 12/2004 | Yamaguchi et al. |
| 2012/0299164 A1 | 11/2012 | Nishimura et al. |

FOREIGN PATENT DOCUMENTS

| | | |
|---|---|---|
| JP | 2003-031791 A | 1/2003 |
| JP | 4362679 B2 | 8/2009 |

OTHER PUBLICATIONS

Office Action mailed Dec. 24, 2014 issued in corresponding JP patent application No. 2012-088455 (and English translation).
Office Action issued Sep. 7, 2015 in the corresponding CN application No. 201280023653.0 (with English translation).

* cited by examiner

LATERAL SEMICONDUCTOR DEVICE

CROSS REFERENCE TO RELATED APPLICATION

This application is a U.S. national stage application of PCT/JP2012/003065 filed on May 10, 2012, and is based on Japanese Patent Application No. 2011-108485 filed on May 13, 2011 and Japanese Patent Application No. 2012-088455 filed on Apr. 9, 2012, the disclosures of which are incorporated herein by reference.

TECHNICAL FIELD

The present disclosure relates to a lateral semiconductor device including a resistive field plate.

BACKGROUND ART

A lateral semiconductor device is formed, for example, using a silicon on insulator (SOI) substrate. As an example of a lateral semiconductor device, a lateral diode is known. At a surface portion of a semiconductor layer of the lateral diode, a cathode region and an anode region are formed. The anode region makes a circuit around the cathode region.

The lateral diode further includes a local oxidation of silicon (LOCOS) layer and a resistive field plate. The LOCOS layer is formed on a surface of the semiconductor layer and is disposed between the cathode region and the anode region. The resistive field plate is formed on a surface of the LOCOS layer. An end of the resistive field plate is electrically connected with the cathode region, and another end of the resistive field plate is electrically connected with the anode region. In the resistive field plate, a micro electric current flows. Accordingly, a potential distribution on the surface of the semiconductor layer between the cathode region and the anode region is equalized and a surface electric field of the semiconductor layer can relax.

As described in the patent document 1, when viewed in a plane, the resistive field plate includes a resistive field plate section having a spiral shape or a concentric circle shape between the cathode region and the anode region.

PRIOR ART DOCUMENTS

Patent Document

[Patent Document 1] JP-A-2000-22175

SUMMARY OF INVENTION

It is an object of the present disclosure to provide a lateral semiconductor device that can increase a freedom of a layout of a resistive field plate section.

A lateral semiconductor device according to an aspect of the present disclosure includes a semiconductor layer, an insulating layer, and a resistive field plate. The semiconductor layer includes a first semiconductor region and a second semiconductor region. The first semiconductor region is formed in a surface portion of the semiconductor layer. The second semiconductor region is formed in the surface portion of the semiconductor layer and makes a circuit around the first semiconductor region. The insulating layer is formed on a surface of the semiconductor layer and is disposed between the first and second semiconductor regions. The resistive field plate is formed on a surface of the insulating layer. One end of the resistive field plate is electrically connected with the first semiconductor region, and another end of the resistive field plate is electrically connected with the second semiconductor region. When viewed in a plane, between the first and second semiconductor regions, a first section and a second section are adjacent to each other along a circumferential direction around the first semiconductor region. The resistive field plate includes a first resistive field plate section and a second resistive field plate section. The first resistive field plate section is formed in the first section and repeats a round trip along the circumferential direction. The second restive field plate section is formed in the second section and repeats a round trip along the circumferential direction. The first resistive field plate section formed in the first section and the second resistive field plate section formed in the second section are separated from each other. According to the above-described lateral semiconductor device, different layouts can be adopted to the first resistive field plate section in the first section, and the second resistive field plate section in the second section.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

The inventors of the present application found the following points in a conventional lateral semiconductor device. When viewed in a plane, a region between a cathode region and an anode region has a race track shape. Thus, the region between the cathode region and the anode region is not uniform along a circumferential direction and includes a corner section, a linear section, and the like. It is known that electric field is normally prone to concentrate at a semiconductor layer corresponding to the corner section. Thus, in the semiconductor layer corresponding to the corner section, it is desired that a length in a radial direction is longer than the linear section.

However, because a resistive field plate having a spiral shape or a concentric circle shape makes a circuit between the cathode region and the anode region, it is difficult to adopt different layouts to the corner section and the linear section. Thus, when the corner section and the linear section are compared, the resistive field plate section formed in the corner section is relatively few with respect to the length between the cathode region and the anode region. If different layouts are adopted to the corner section and the linear section, as long as the resistive field plate sections in the corner section and the linear section contact, a micro electric current flows to both via a contact portion. Thus, influence is not a little. In view of the influence, a compromising layout which is not optimal to the corner section and the linear section has to be adopted. The inventors of the present application made the present invention with focusing on the above-described points.

A lateral semiconductor device according to the following embodiment of the present disclosure is formed in a multi-layer substrate in which a support layer, a buried insulating layer, and an active layer are stacked. It is preferable that the multilayer substrate is a SOI substrate. The lateral semiconductor device is formed in an island region surrounded by an insulated isolation trench that makes a circuit of the active layer. The lateral semiconductor device includes a semiconductor structure formed in the semiconductor layer. The semiconductor structure includes plural kinds of semiconductor regions and controls electric current that flows in the semiconductor layer. As the semiconductor structure, a diode structure, an insulated gate bipolar transistor (IGBT) structure, a metal-oxide semiconductor field-effect transistor (MOSFET) structure, or the like is used. In a case of the diode structure, a first semiconductor region is an n-type cathode region, and a second semiconductor region is a p-type anode region. In a case of the IGBT, a first semiconductor region is a p-type collector region, and a second semiconductor region is an n-type emitter region. In a case of the MOSFET, a first semiconductor region is an n-type drain region, and a second semiconductor region is an n-type source region.

Figure 1:
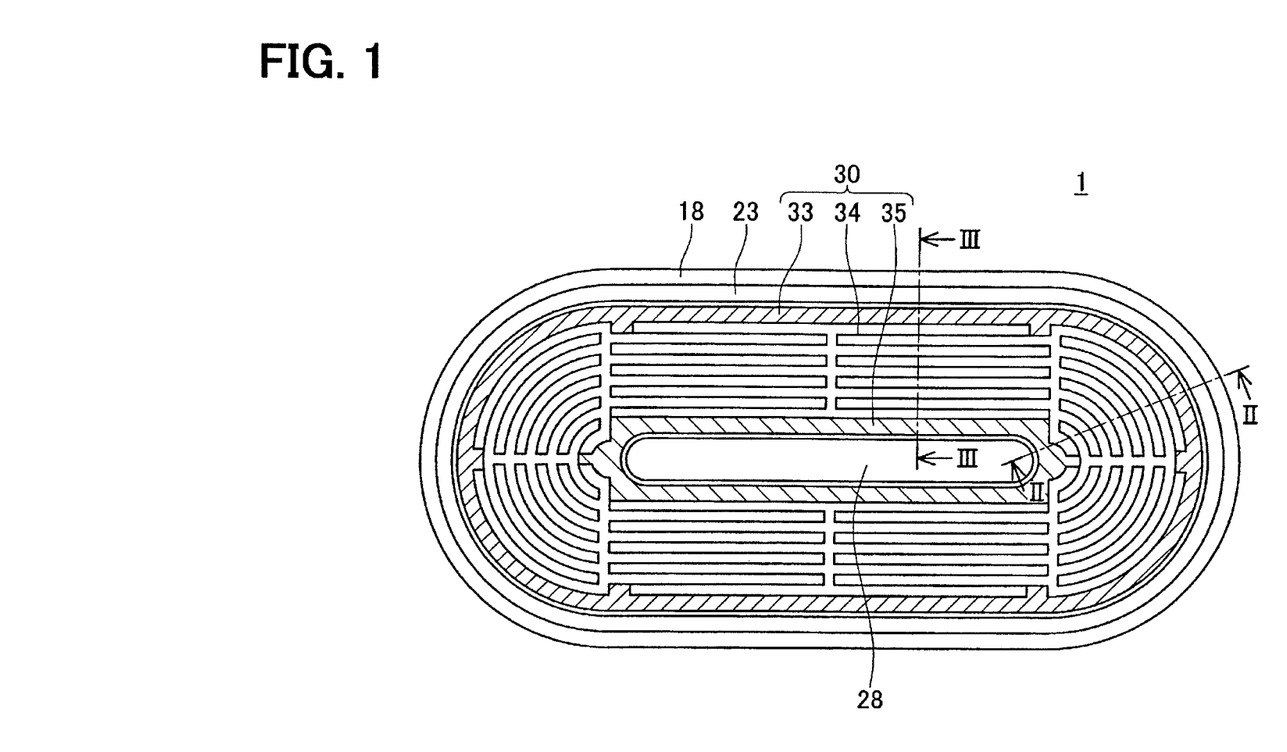
FIG. 1 is plane view showing a lateral diode according to an embodiment of the present disclosure.
Figure 2:
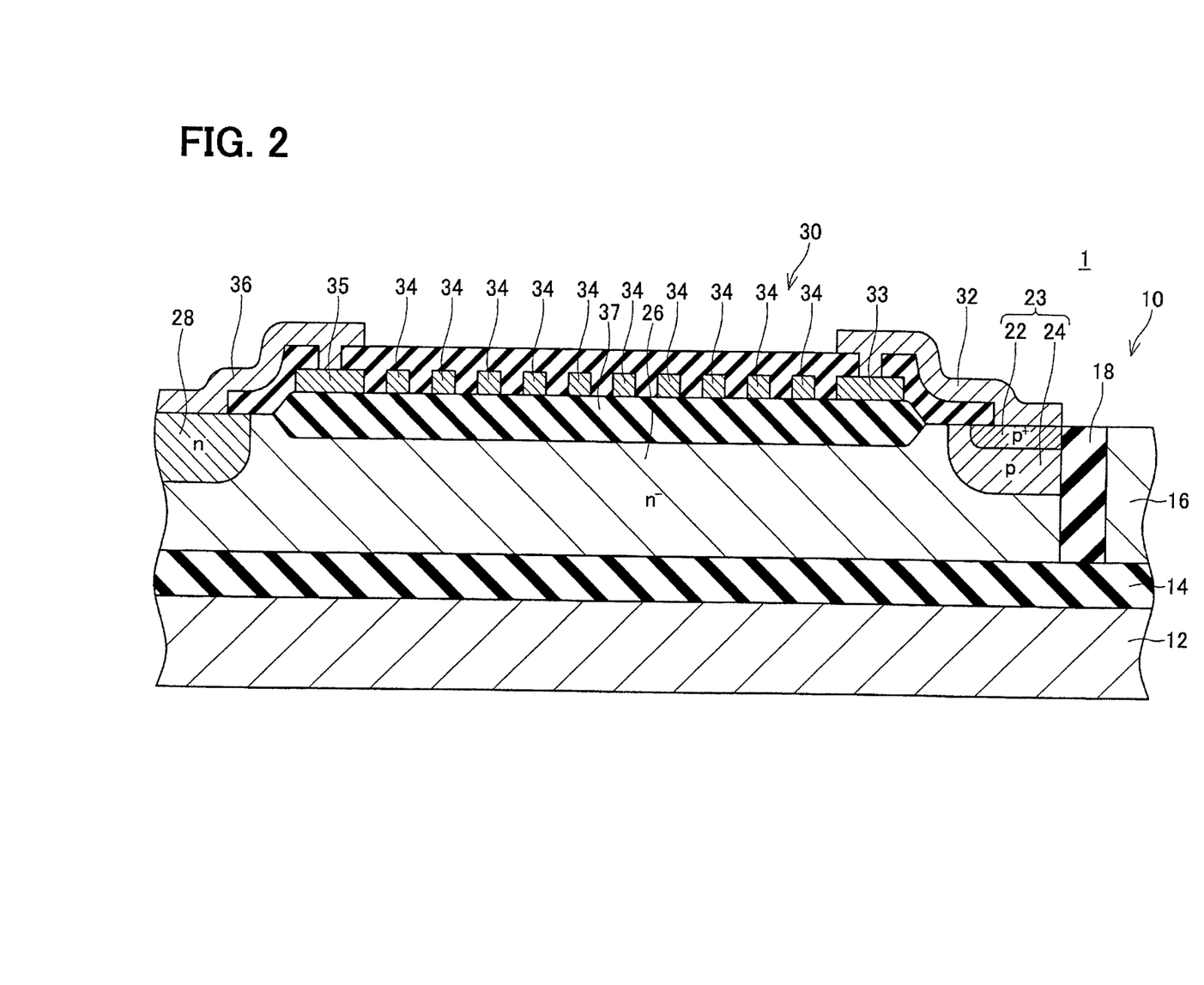
FIG. 2 is a cross-sectional view of the lateral diode taken along line II-II in FIG. 1.
Figure 3:
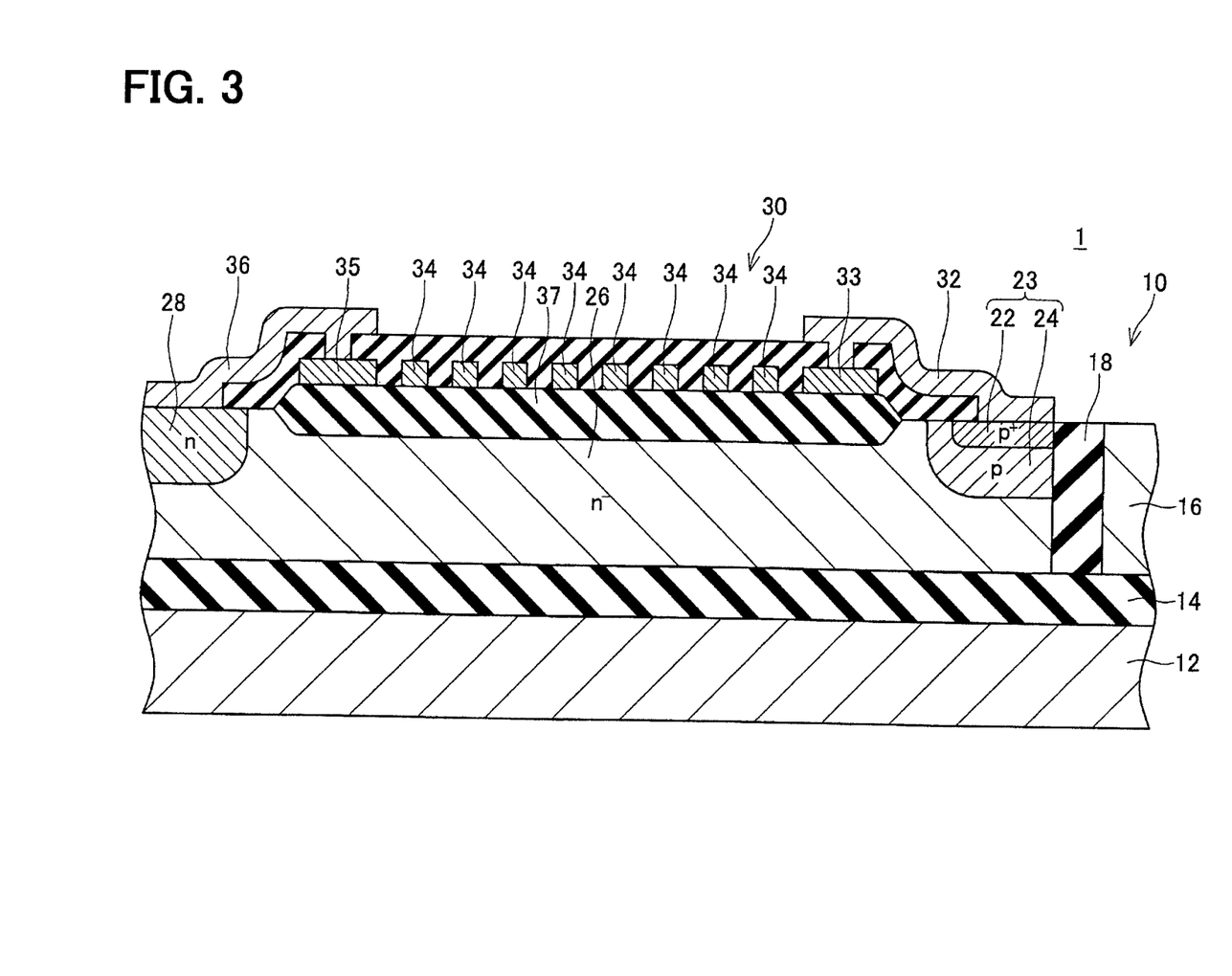
FIG. 3 is a cross-sectional view of the lateral diode taken along line III-III in FIG. 1.

As shown in FIG. 1 to FIG. 3, a lateral diode 1 according an embodiment of the present disclosure is formed in a SOI substrate 10 in which a support layer 12 of n-type or p-type, a buried insulating layer 14, and an active layer 16 of n⁻-type are stacked. As shown in FIG. 1, the diode 1 is formed in an island region of the active layer 16 surrounded by an insulated isolation trench 18. The insulated isolation trench 18 extends from a surface of the active layer 16 to the buried insulating layer 14 through the active layer 16. When viewed in a plane, the insulated isolation trench 18 makes a circuit of a part of the active layer 16. In an example, the support layer 12 and the active layer 16 are made of single crystal silicon and the buried insulating layer 14 is made of silicon oxide.

The diode 1 includes a cathode region 28 of n-type, an anode region 23 of p-type, and a drift region 26 of n⁻-type. The cathode region 28, the anode region 23, and the drift region 26 form a diode structure and controls electric current that flows in a horizontal direction in the active layer 16. Specifically, when a forward bias is applied between the cathode region 28 and the anode region 23 (when the anode region 23 is connected to a high potential side), electric current flows between the cathode region 28 and the anode region 23. On the other hand, when a reverse bias is applied between the cathode region 28 and the anode region 23 (when the cathode region 28 is connected to the high potential side), the cathode region 28 is electrically disconnected with the anode region 23.

As shown in FIG. 1, the cathode region 28 is disposed at a center portion of the island region and extends in one direction. The cathode region 28 can be formed, for example, by implanting phosphorus ions to the surface portion of the active layer using an ion implantation technique. Although the cathode region 28 is formed by one diffusion region in this example, the cathode region 28 may disperse in the one direction. In addition, a region of p⁺-type may be partially formed so as to be in contact with the cathode region 28.

The anode region 23 is disposed in a peripheral portion of the island region. The anode region 23 makes a circuit around the cathode region 28 with being in contact with the insulated isolation trench 18. The anode region 23 includes a high concentration anode region 22 and a low concentration anode region 24. The low concentration anode region 24 is formed to a depth deeper than the high concentration anode region 22 and surrounds the high concentration anode region 22. Shapes of the high concentration anode region 22 and the low concentration anode region 24 are not limited to this example. For example, an area of the high concentration anode region 22 may be smaller, and a part of the low concentration anode region 24 may be in contact with an anode electrode 32. A depth of the low concentration anode region 24 may be partially changed. The anode region 23 can be formed, for example, by implanting boron ions to the surface portion of the active layer 16 using an ion implantation technique.

The drift region 26 is formed between the cathode region 28 and the anode region 23. The drift region 26 is a remaining portion of the active layer 16 in which the cathode region 28 and the anode region 23 are formed. In the drift region 26, a semiconductor region for increasing a breakdown voltage (e.g., a RESURF region) may be formed.

The diode 1 further includes a cathode electrode 36, the anode electrode 32, a local oxidation of silicon (LOCOS) layer 37, and a resistive field plate 30 formed on the surface of the active layer 16.

The cathode electrode 36 is disposed in the center portion of the island region and is in direct contact with the cathode region 28. The anode electrode 32 is disposed in the peripheral portion of the island region and is in direct contact with the anode region 23.

The LOCOS layer 37 is formed on the surface of the active layer 16 and is disposed between the cathode region 28 and the anode region 23. The LOCOS layer 37 is disposed above the drift region 26. The LOCOS layer 37 is made of, for example, silicon oxide.

The resistive field plate 30 is formed on the surface of the LOCOS layer 37. The resistive field plate 30 includes an inner peripheral resistive field plate section 35, a middle resistive field plate section 34, and an outer peripheral resistive field plate section 33. The inner peripheral resistive field plate section 35 is disposed so as to make a circuit of the center portion of the island region. The inner peripheral resistive field plate section 35 is electrically connected with the cathode region 28 via the cathode electrode 36. The outer peripheral resistive field plate section 33 is disposed so as to make a circuit of the peripheral portion of the island region. The outer peripheral resistive field plate section 33 is connected with the anode region 23 via the anode region 23. The middle resistive field plate section 34 is connected with both of the inner peripheral resistive field plate section 35 and the outer peripheral resistive field plate section 33.

Figure 4:
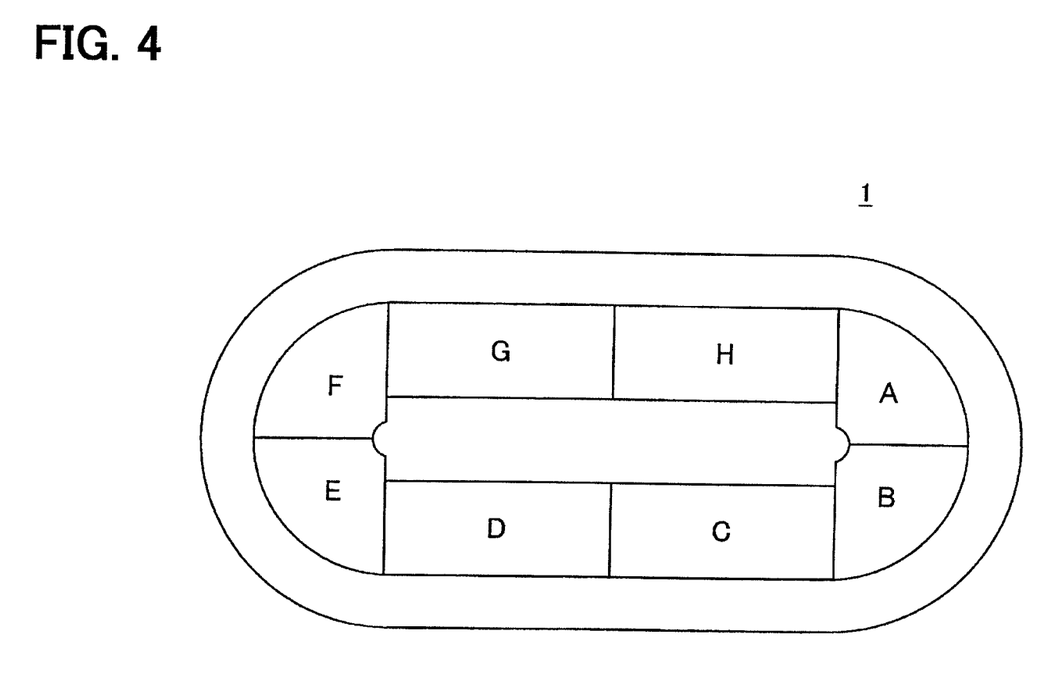
FIG. 4 is a diagram showing a corner section and a linear section of the lateral diode.

As shown in FIG. 1 and FIG. 4, when viewed in a plane, the region between the cathode region 28 and the anode region 23 has a race track shape. As shown in FIG. 4, the region having the race track shape includes corner sections A, B, E, F and linear sections C, D, G, H.

As shown in FIG. 1 and FIG. 4, in the middle resistive field plate section 34 formed in each of the sections A-H, one end is in contact with the inner peripheral resistive field plate section 35 and another end is in contact with the outer resistive field plate section 33. In addition, the middle resistive field plate section 34 formed in each of the sections A-H is separated from the middle resistive field plate section 34 formed in the adjacent section.

The middle resistive field plate section 34 formed in the corner sections A, B, E, F repeats a round trip along a circumferential direction of the cathode region 28 between the cathode region 28 and the anode region 23. In this example, the middle resistive field plate section 34 makes five round trips between the cathode region 28 and the anode region 23. When viewed in a direction connecting the cathode region 28 and the anode region 23, a length between the adjacent middle resistive field plate sections 34 is constant and is fixed to a predetermined value.

The middle resistive field plate section 34 formed in the linear sections C, D, G, H repeats a round trip along a circumferential direction of the cathode region 28 between the cathode region 28 and the anode region 23. In this example, the middle resistive field plate section 34 makes four round trips between the cathode region 28 and the anode region 23. When viewed in a direction connecting the cathode region 28 and the anode region 23, a length between the adjacent middle resistive field plate sections 34 is constant and is fixed to a predetermined value. The length between the adjacent middle resistive field plate sections 34 in the corner sections A, B, E, F when viewed in the direction connecting the cathode region 28 and the anode region 23 and the length between the adjacent middle resistive field plate sections 34 in the linear sections C, D, G, H when viewed in the direction connecting the cathode region 28 and the anode region 23 are the same.

FIG. 2 shows an example of the middle resistive field plate section 34 formed in the corner sections A, B, E, F. FIG. 3 shows an example of the middle resistive field plate section 34 formed in the linear sections C, D, G, H. Electric field is prone to concentrate at the drift regions 26 corresponding to the corner sections A, B, E, F. Thus, a horizontal length of the drift region 26 (i.e., a length between the cathode region 28 and the anode region 23) is larger in the corner sections A, C, E, F than the linear sections C, D, G, H. As described above, the number of round trips of the middle resistive field plate section 34 formed in the corner sections A, B, E, F is larger than the number of round trips of the middle resistive field plate section 34 formed in the linear sections C, D, G, H. Thus, in any of the corner sections A, B, E, F and the linear sections C, D, G, H, the middle resistive field plate section 34 is uniformly formed above all sections of the drift region 26. In other words, arrangement intervals of the middle resistive field plate sections 34 with respect to the horizontal length of the drift region 26 are the same in the corner sections A, B, E, G and the linear sections C, D, G, H. Thus, in any of the corner sections A, B, E, F and the linear sections C, D, G, H, the surface electric field of the drift region 26 relaxes and the diode 1 having a high breakdown voltage is realized.

Figure 5:
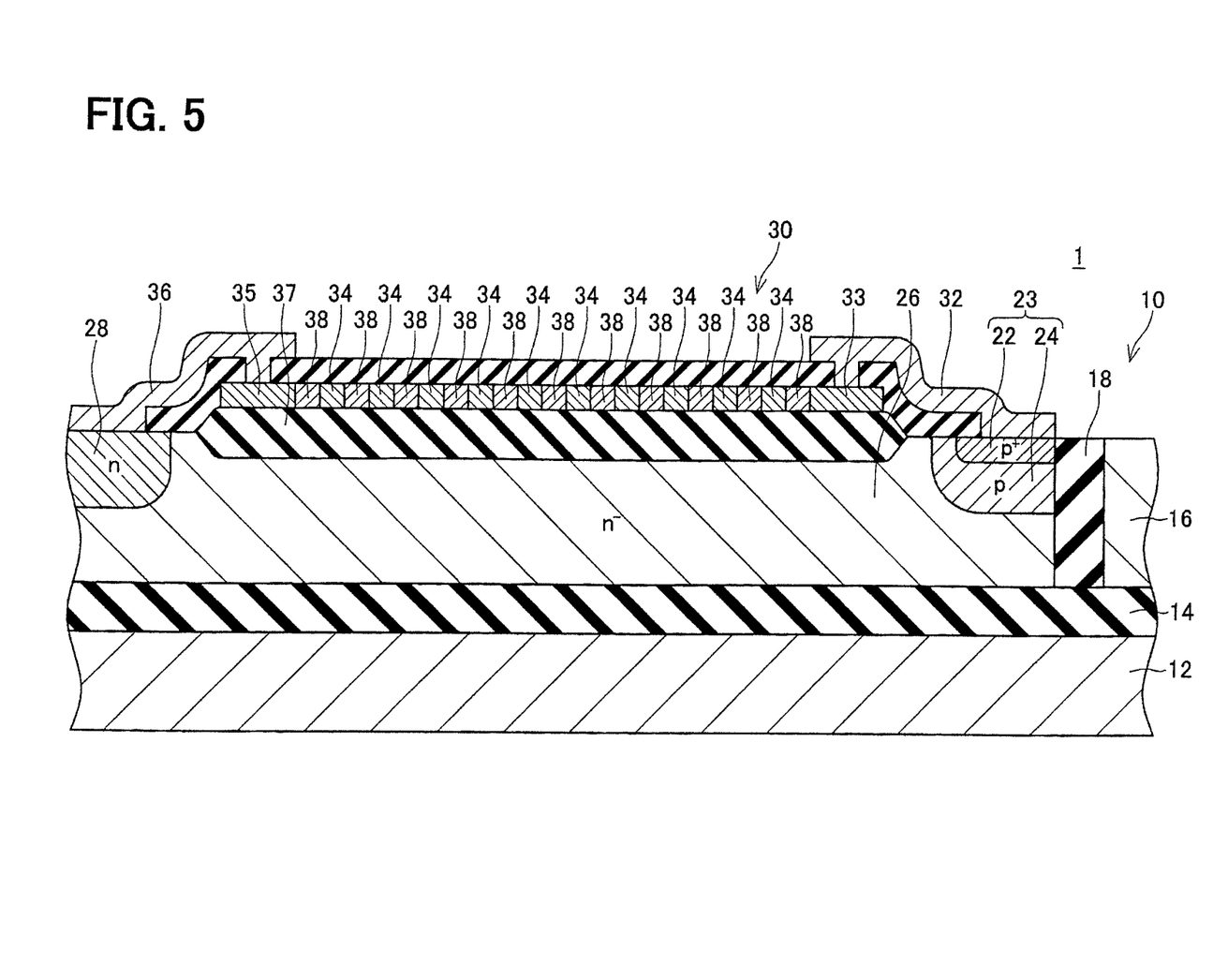
FIG. 5 is a diagram showing a lateral diode according to a first modification.

A diode 1 according to a first modification of the present embodiment is shown in FIG. 5. In the diode 1, a semiconductor region 38 having a high resistance is formed between the adjacent middle resistive field plate sections 34. The diode 1 is characterized in that the resistive field plate 30 and the semiconductor region 38 are formed using an ion implantation technique. Specifically, after a high resistance semiconductor layer is formed on the surface of the LOCOS layer 37, a mask having an opening at a portion corresponding to a forming portion of the resistive field plate 30 is patterned. Next, an impurity is introduced to the high resistance semiconductor layer through the opening to selectively introduce the impurity to the forming portion of the resistive field plate 30. After that, an annealing process is performed so as to individually form the resistive field plate 30 and the semiconductor region 38. Because an etching process is unnecessary when this manufacturing method is used, a processing variation can be restricted.

Figure 6:
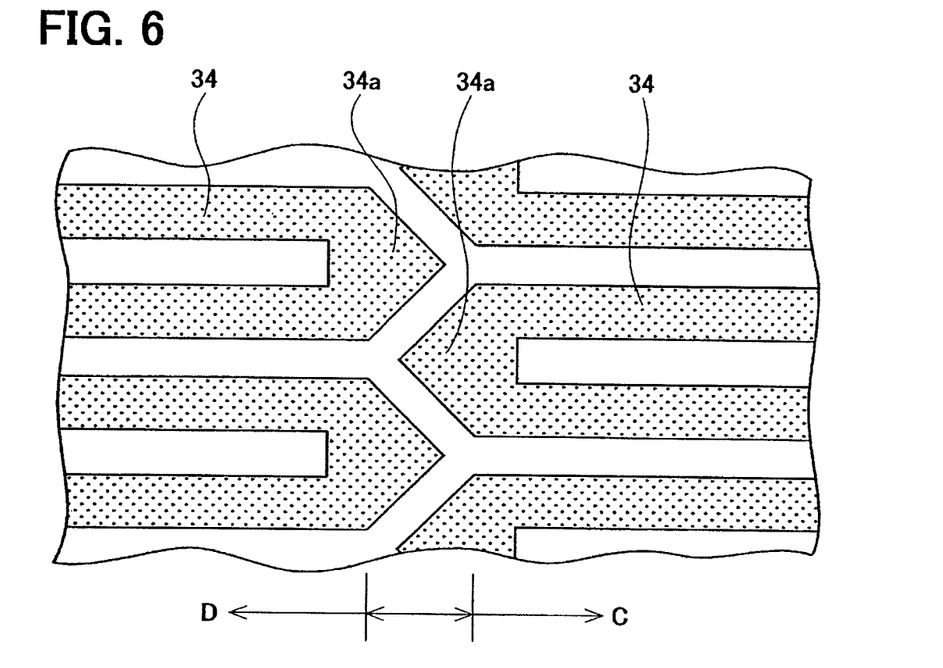
FIG. 6 is a diagram showing a boundary of linear sections C and D of a lateral diode according to a second modification.
Figure 7:
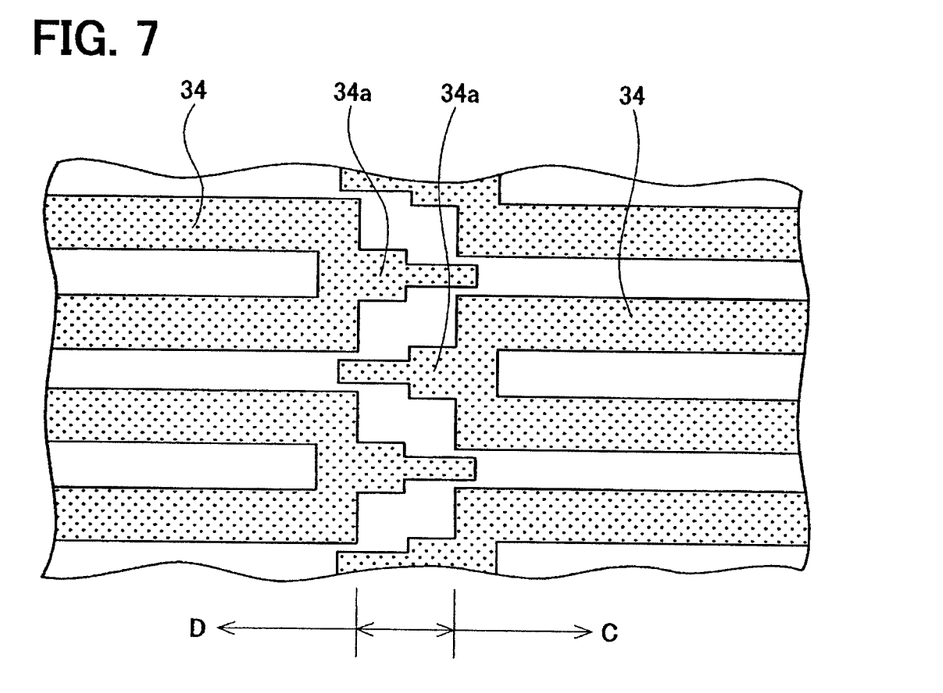
FIG. 7 is a diagram showing a boundary of linear sections C and D of a lateral diode according to a third modification.

FIG. 6 is a diagram showing a boundary of linear sections C, D of a lateral diode 1 according to a second modification of the present embodiment. As shown in FIG. 6, the middle resistive field plate section 34 in the linear section C has a protruding portion 34a that protrudes toward the linear section D. Similarly, the middle resistive field plate section 34 in the linear section D has a protruding portion 34a that protrudes toward the linear section C. Accordingly, at a region between the linear sections C and F, the protruding portion 34a is repeatedly formed in a direction between the anode and the cathode (an up-and-down direction in FIG. 6). FIG. 7 is a diagram showing a boundary of linear sections C, D of a lateral diode 1 according to a third modification of the present embodiment. The protruding portions 34a may have a step shape as shown in FIG. 7. When the protruding portions 34a are provided as the second and third modification, a blank portion, at which the middle resistive field plate section 34 does not exist, does not exist between a boundary portion of the linear sections C and D. Thus, the surface electric field of the drift region 26 relaxes also at the boundary portion of the linear sections C and D, and the diode 1 having a high breakdown voltage can be realized. Although the boundary portion of the linear sections C and D are illustrated in FIG. 6 and FIG. 7, it is preferable that a similar structure is formed also in other portion.

Figure 8:
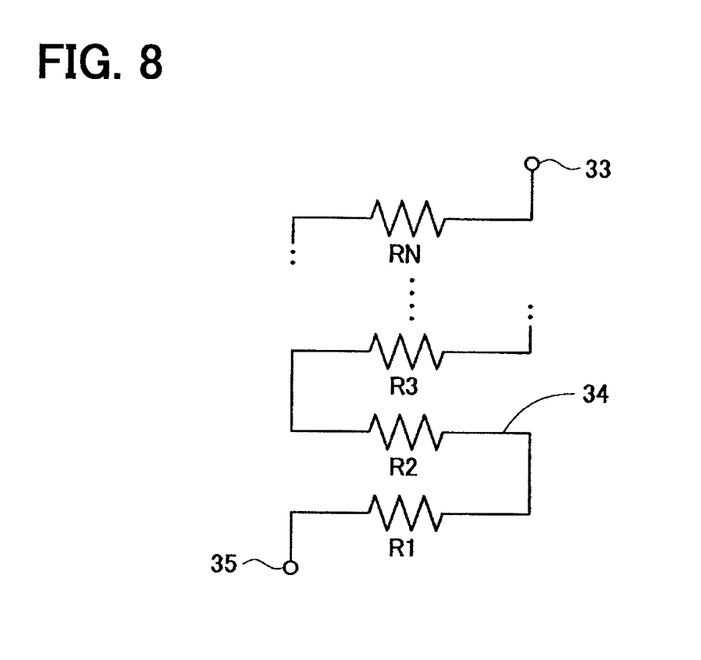
FIG. 8 is a diagram showing a concept of a resistance value of each portion forming a middle resistive field plate section of a lateral diode according to a fourth modification.

FIG. 8 is a diagram showing a concept of a resistance value of each portion forming a middle resistive field plate section 34 of a lateral diode 1 according to a fourth modification of the present embodiment. The middle resistive field plate section 34 includes a plurality of portions extending along the circumferential direction (hereafter, referred to as arc portions). A resistance value of the arc portion closest to the cathode (the innermost side) is set to R1, and a resistance value of the arc portion closest to the anode (the outermost side) is set to RN. In the middle resistive field plate section 34 formed in the corner sections A, B, E, F, the length of the arc portion in the circumferential direction increase from the cathode side to the anode side. Thus, when the width of the middle resistive field plate section 34 is constant, a relationship of R1<R2<R3< . . . <RN is satisfied. In the diode 1, the width of the middle resistive field plate section 34 is increased from the cathode side (the innermost side) to the anode side (the outermost side) so that a relationship of R1=R2=R3= . . . =RN is satisfied. Accordingly, the surface potential distribution of the drift region 26 is equalized in the direction between the anode and the cathode, and the surface electric field relaxes.

Figure 9:
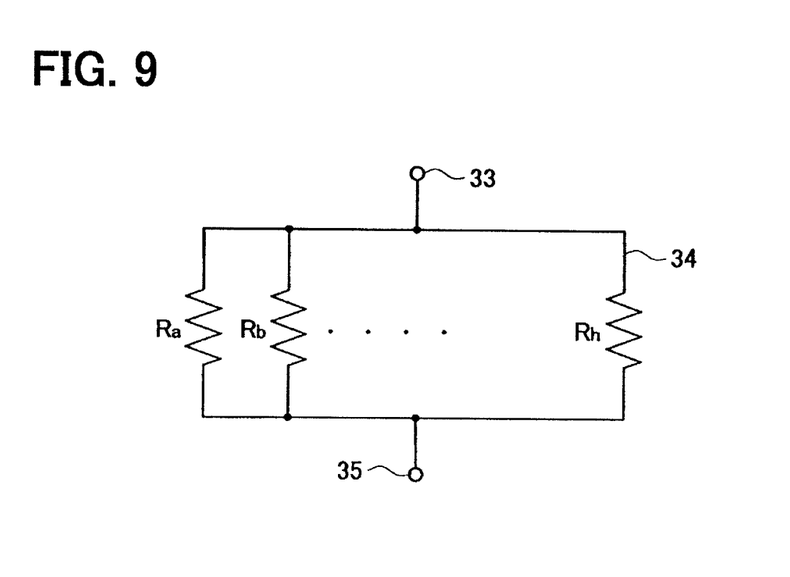
FIG. 9 is a diagram showing a concept of a resistance value of a middle resistance field plate section provided in each section of a lateral diode according to a fifth modification.

FIG. 9 is a diagram showing a concept of a resistance value of a middle resistance field plate section provided in each section of a lateral diode 1 according to a fifth modification of the present embodiment. The middle resistive field plate sections 34 formed in the sections A-H is connected in parallel between the inner peripheral resistive field plate section 35 and the outer peripheral resistive field plate section 33. A resistance value of the middle resistive field plate section 34 formed in the corner section A is Ra, and a resistance value of the middle resistive field plate section 34 formed in the linear section H is Rh. In the diode 1, although a layout of the middle resistive field plate section 34 is different between the corner sections A, B, E, F and the linear sections C, D, G, H, a relationship of Ra=Rb= . . . =Rh is satisfied. Accordingly, electric current that flows in each of the middle resistive field plate sections 34 becomes the same, imbalance of electric current is restricted, the surface electric field of the drift region 26 relaxes, and the diode 1 having a high breakdown voltage is realized.

In the above-described embodiment, the active layer 16 is an example of the semiconductor layer, the cathode region is an example of a first semiconductor region, the anode region is an example of a second semiconductor region, and the LOCOS layer 37 is an example of an insulating layer. In the sections A-H, adjacent two sections are examples of a first section and a second section, respectively, the middle resistive field plate section 34 formed in the first section is an example of a first resistive field plate section, and the middle resistive field plate section 34 formed in the second section is an example of the second resistive field plate section.

Although the examples of the present invention have been described in detail above, these are only exemplification and do not limit a scope of claims. Various changes and modifications of the examples are included in the technology described in the claims.

For example, although an example in which silicon is used as the semiconductor material is described in the above-described embodiment, instead of this example, a wide gap semiconductor may be used.

The technical elements described in the present specification and the drawings exert technical utility by itself or various combinations, and are not limited to the combinations described in claims at filing. The techniques exemplified in the present specification and the drawings can achieve plural objects at the same time, and have technical utility by achieving one of the objects.

The invention claimed is:

1. A lateral semiconductor device comprising:
a semiconductor layer including a first semiconductor region and a second semiconductor region at a surface portion, the second semiconductor region making a circuit around the first semiconductor region;
an insulating layer formed on a surface of the semiconductor layer and disposed between the first semiconductor region and the second semiconductor region; and
a resistive field plate having a single conductivity type and formed on a surface of the insulating layer, one end of the resistive field plate electrically connected with the first semiconductor region, another end of the resistive field plate electrically connected with the second semiconductor region, wherein
when viewed in a plane, between the first semiconductor region and the second semiconductor region, a first section and a second section are adjacent to each other along a circumferential direction around the first semiconductor region,
the resistive field plate includes a first resistive field plate section formed in the first section and repeating a round trip along the circumferential direction and a second resistive field plate section formed in the second section and repeating a round trip along the circumferential direction,
the first resistive field plate section formed in the first section and the second resistive field plate section formed in the second section are separated from each other
the first resistive field plate section includes a first resistive field plate protruding portion protruding toward the second section,
the second resistive field plate section includes a second resistive field plate protruding portion protruding toward the first section,
when viewed in a plane, the first resistive field plate protruding portion and the second resistive field plate protruding portion are repeatedly formed along a direction connecting the first semiconductor region and the second semiconductor region, and
the resistive field plate protruding portion interdigitates with the second resistive field plate.

2. The lateral semiconductor device according to claim 1, wherein
a number of round trips of the first resistive field plate section formed in the first section and a number of round trips of the second resistive field plate section formed in the second section are different.

3. The lateral semiconductor device according to claim 2, wherein
when viewed in a plane, a region between the first semiconductor region and the second semiconductor region includes a corner section and a linear section,
the first section is included in the corner section,
the second section is included in the linear section, and
the number of round trips of the first resistive field plate section formed in the first section is larger than the number of round trips of the second resistive field plate section formed in the second section.

4. The lateral semiconductor device according to claim 3, wherein
resistance values of respective portions of the first resistance field plate section extending along the circumferential direction are substantially equal to each other.

5. The lateral semiconductor device according to claim 1, wherein
a resistance value of the first resistive field plate section and a resistance value of the second resistance field plate section are substantially equal to each other.

6. The lateral semiconductor device according to claim 1, wherein
the resistive field plate protruding portion and the second resistive field plate protruding portion interdigitate in a step shape.

* * * * *